US012417336B1

(12) United States Patent
Najibi et al.

(10) Patent No.: US 12,417,336 B1
(45) Date of Patent: Sep. 16, 2025

(54) MODIFYING A CURRENT CIRCUIT DESIGN USING DATA FROM ONE OR MORE PREVIOUS CIRCUIT DESIGNS IDENTIFIED AS BEING SIMILAR TO THE CURRENT CIRCUIT DESIGN

(71) Applicant: Synopsys, Inc., Mountain View, CA (US)

(72) Inventors: Mehrdad Najibi, San Ramon, CA (US); Amzie Adams, Raleigh, NC (US); Piyush Verma, Sunnyvale, CA (US); Joe Walston, Durham, NC (US); Pranay Prakash, Fremont, CA (US); Thomas Andersen, San Jose, CA (US)

(73) Assignee: Synopsys, Inc., Sunnyvale, CA (US)

( * ) Notice: Subject to any disclaimer, the term of this patent is extended or adjusted under 35 U.S.C. 154(b) by 733 days.

(21) Appl. No.: 17/853,476

(22) Filed: Jun. 29, 2022

Related U.S. Application Data

(60) Provisional application No. 63/217,758, filed on Jul. 1, 2021.

(51) Int. Cl.
*G06F 30/398* (2020.01)
*G06F 30/27* (2020.01)
*G06F 30/392* (2020.01)
*G06F 30/396* (2020.01)

(52) U.S. Cl.
CPC ............ *G06F 30/398* (2020.01); *G06F 30/27* (2020.01); *G06F 30/392* (2020.01); *G06F 30/396* (2020.01)

(58) Field of Classification Search
USPC ......................................................... 716/111
See application file for complete search history.

(56) References Cited

U.S. PATENT DOCUMENTS

2020/0349482 A1\* 11/2020 Grossman .............. G06N 3/088
2021/0012054 A1\* 1/2021 Adler .................... H05K 3/4038
2024/0012953 A1\* 1/2024 Varro ...................... G06F 30/10

FOREIGN PATENT DOCUMENTS

DE         102019112439 A1 \*  4/2020  ............ G06F 30/27

\* cited by examiner

*Primary Examiner* — Mohammed Alam
(74) *Attorney, Agent, or Firm* — Andrew L. Dunlap; Haynes Beffel & Wolfeld LLP

(57) ABSTRACT

A method of electronic design automation (EDA) using machine learning to modify a current circuit design is provided. The method includes searching for data associated with previous design sessions for previous circuit designs, the searching being performed by implementing machine learning to identify similarities between the current circuit design and the previous circuit designs and the searching providing simulation data identifying the previous design sessions and simulation results of the previous design sessions, determining, in dependence on the simulation data, a respective degree of relevance between the current circuit design and the previous circuit designs, and performing a modification by applying the simulation data to the current circuit design based on the degree of relevance, the applying of the simulation data including performing simulations that apply values obtained from the simulation data to parameters related to the current circuit design and settings related to a simulation of the current design.

20 Claims, 7 Drawing Sheets

MODIFYING A CURRENT CIRCUIT DESIGN USING DATA FROM ONE OR MORE PREVIOUS CIRCUIT DESIGNS IDENTIFIED AS BEING SIMILAR TO THE CURRENT CIRCUIT DESIGN

RELATED APPLICATION

This application claims priority to U.S. Provisional Application No. 63/217,758, filed on 1 Jul. 2021 and titled "LEVERAGING RESULTS OF PREVIOUS MACHINE LEARNING-BASED SEARCHES FOR CIRCUIT DESIGN", which is incorporated herein.

TECHNICAL FIELD

The present disclosure relates to electronic design automation (EDA) using machine learning to develop circuit designs prior to fabrication of electronic circuits.

BACKGROUND

Due to the ever-increasing complexity of new integrated circuit (IC) devices, Electronic Design Automation (EDA) software tools are now considered essential in the process of converting each new electronic system idea into a corresponding IC device using one or more IC "chips". Specifically, IC designers utilize EDA tools to (i) develop an initial IC design (i.e., software description of the IC device) that they believe is capable of implementing a new electronic function (e.g., operational objectives), (ii) analyze and modify the initial IC design in order to verify that the final IC design performs the operational objectives set, and then (iii) generate and check a series of IC layouts (e.g., mask designs or mask layouts) that define a physical IC chip capable of implementing the final IC design. Because modern IC devices, such as System-on-Chip (SoC) devices, can include billions of individual circuit components, it is essential to use EDA tools to develop and produce modern IC devices.

SUMMARY

In an embodiment, a method of electronic design automation (EDA) using machine learning to modify a current circuit design in a current design session is provided. The method can include searching a database for data associated with previous design sessions for one or more previous circuit designs, the searching being performed, at least in part, by implementing machine learning to identify similarities between the current circuit design and the one or more previous circuit designs and the searching providing simulation data identifying the previous design sessions for the one or more previous circuit designs and simulation results of the previous design sessions for the one or more previous circuit designs. The method can further include determining, in dependence on the simulation data, a respective degree of relevance between the current circuit design and the one or more previous circuit designs, and performing a modification of the current circuit design by applying the simulation data to the current circuit design based at least in part on the determined degree of relevance, the applying of the simulation data to the current circuit design including performing one or more simulations, of the current circuit design, that apply values obtained from the simulation data to parameters related to at least one of (i) the current circuit design and (ii) settings related to a simulation of the current circuit design.

In another embodiment, the applying of the simulation data to the current circuit design can modify the current circuit design by adjusting parameters of the current circuit design and the simulation of the current circuit design in dependence on values obtained from the simulation data that resulted in a simulation of the previous circuit design that provided results that satisfy a defined criteria.

In a further embodiment, the determining of the respective degree of relevance between the current circuit design and the one or more previous circuit designs can include receiving, from a user, a selection of a relevance between the current circuit design and each of the one or more previous circuit designs.

In an embodiment, the relevance can indicate one of a high similarity, a medium similarity and a low similarity between the current circuit design and each of the one or more previous circuit designs.

In another embodiment, a range of a number of simulations performed using different parameter values for the current circuit design is set in dependence on whether the relevance indicates high similarity, medium similarity or low similarity.

In a further embodiment, the method can include applying the simulation data, associated with multiple previous design sessions having varying degrees of relevance, to the current design session.

In an embodiment, the simulation data associated with the multiple previous design sessions can include one or more permuton settings that were simulated on previous circuit designs during the previous design sessions.

In another embodiment, the permuton settings can include one or more of (i) EDA operation options with respect to simulations of the previous circuit designs, (ii) EDA flow variations with respect to the simulations of the previous circuit designs, (iii) values of input parameters with respect to simulations of the previous circuit designs, (iv) input settings with respect to simulations of the previous circuit designs, and (v) design settings of the previous circuit designs during the simulations.

In a further embodiment, the simulation data associated with the previous design sessions can include one or more results of the modifications of the previous circuit designs, the one or more results including power results, performance results and area results associated with the permuton settings implemented during the simulations.

In an embodiment, the searching of the database can implement a searching strategy of searching the database for previous circuit designs having permuton settings that were applied on a previous design modification during the previous design sessions, wherein the searching strategy is selected in dependence on the respective degree of relevance between the current circuit design and the one or more previous circuit designs.

In another embodiment the method can further include receiving a selection of a point in a design process flow, from among a plurality of points in the design process flow, to simulate for the current circuit design, wherein the searching of the database can implement the machine learning to identify similarities between the current circuit design and the one or more previous circuit designs for the selected point in the design process to provide simulation data that is relevant to the selected point in the design process, and wherein the performing of the modification of the current circuit design can apply the simulation data that is relevant to the selected point in the design process.

In a further embodiment, a plurality of points in the design process flow can include, at least, physical placement of circuit components, routing of connections of the circuit components and clock tree synthesis.

In an embodiment, the method can further include receiving a selection of a point in a design process flow, from among a plurality of points in the design process flow, to simulate for the current circuit design, and the applying of the simulation data to the current circuit design can select simulation data, with respect to a previous circuit design, from another point in the design process flow that is different from the selected point in the design process flow.

In another embodiment, the other point in the design process flow can be routing of connections of circuit components of the previous circuit design, the selected point in the design process can be physical placement of circuit components of the current circuit design, and the simulation of the current circuit design can simulate the current circuit design with respect to the selected point in the design process using simulation data obtained in dependence on the other point in the design process flow.

In a further embodiment, the simulation data obtained in dependence on the other point in the design process flow can be obtained from the database in dependence upon results from performing a simulation of the previous circuit design with respect to the routing of the connections of the circuit components of the previous circuit design, and the simulation of the current circuit design can be performed with respect to the physical placement of the circuit components of the current circuit design using the simulation data of the previous circuit obtained with respect to the routing connections of the circuit components of the previous circuit design.

In an embodiment, the similarities between the current circuit design and the one or more previous circuit designs can be identified by the machine learning based on at least one of (i) structural design features between the previous circuit designs and the current circuit design and (ii) performance results between the previous circuit designs and the current circuit design.

In another embodiment, the similarities between the current circuit design and the one or more previous circuit designs can be identified by the machine learning based on functional features between the previous circuit design and the current circuit design.

In an embodiment, the database can be a combination of databases utilized by a plurality of EDA implementations.

In a further embodiment, a non-transitory computer-readable recording medium comprising stored instructions is provided. The stored instructions can be executed by a processor to use machine learning to optimize a current circuit design in a current design session by performing operations. The operations can include searching a database for data associated with previous design sessions for one or more previous circuit designs, the searching being performed, at least in part, by implementing machine learning to identify similarities between the current circuit design and the one or more previous circuit designs and the searching providing simulation data identifying the one or more previous circuit designs and simulation results of the one or more previous circuit designs, determining, in dependence on the simulation data, a respective degree of relevance between the current circuit design and the one or more previous circuit designs, and performing an optimization of the current circuit design by applying the simulation data to the current circuit design based at least in part on the determined degree of relevance, the applying of the simulation data to the current circuit design including performing one or more simulations, of the current circuit design, that apply values obtained from the simulation data to parameters related to at least one of (i) the current circuit design and (ii) a simulation of the current circuit design.

In an embodiment, a system comprising a processor and a memory is provided. The memory can store instructions that, when executed by the processor, cause the processor to use machine learning to modify a current circuit design in a current design session by performing a method. The method can include searching a database for data associated with previous design sessions for one or more previous circuit designs, the searching being performed, at least in part, by implementing machine learning to identify similarities between the current circuit design and the one or more previous circuit designs and the searching providing simulation data identifying the one or more previous circuit designs and simulation results of the one or more previous circuit designs, determining, in dependence on the simulation data, a respective degree of relevance between the current circuit design and the one or more previous circuit designs, and performing a modification of the current circuit design by applying the simulation data to the current circuit design based at least in part on the determined degree of relevance, the applying of the simulation data to the current circuit design including performing one or more simulations, of the current circuit design, that apply values obtained from the simulation data to parameters related to at least one of (i) the current circuit design and (ii) a simulation of the current circuit design.

DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
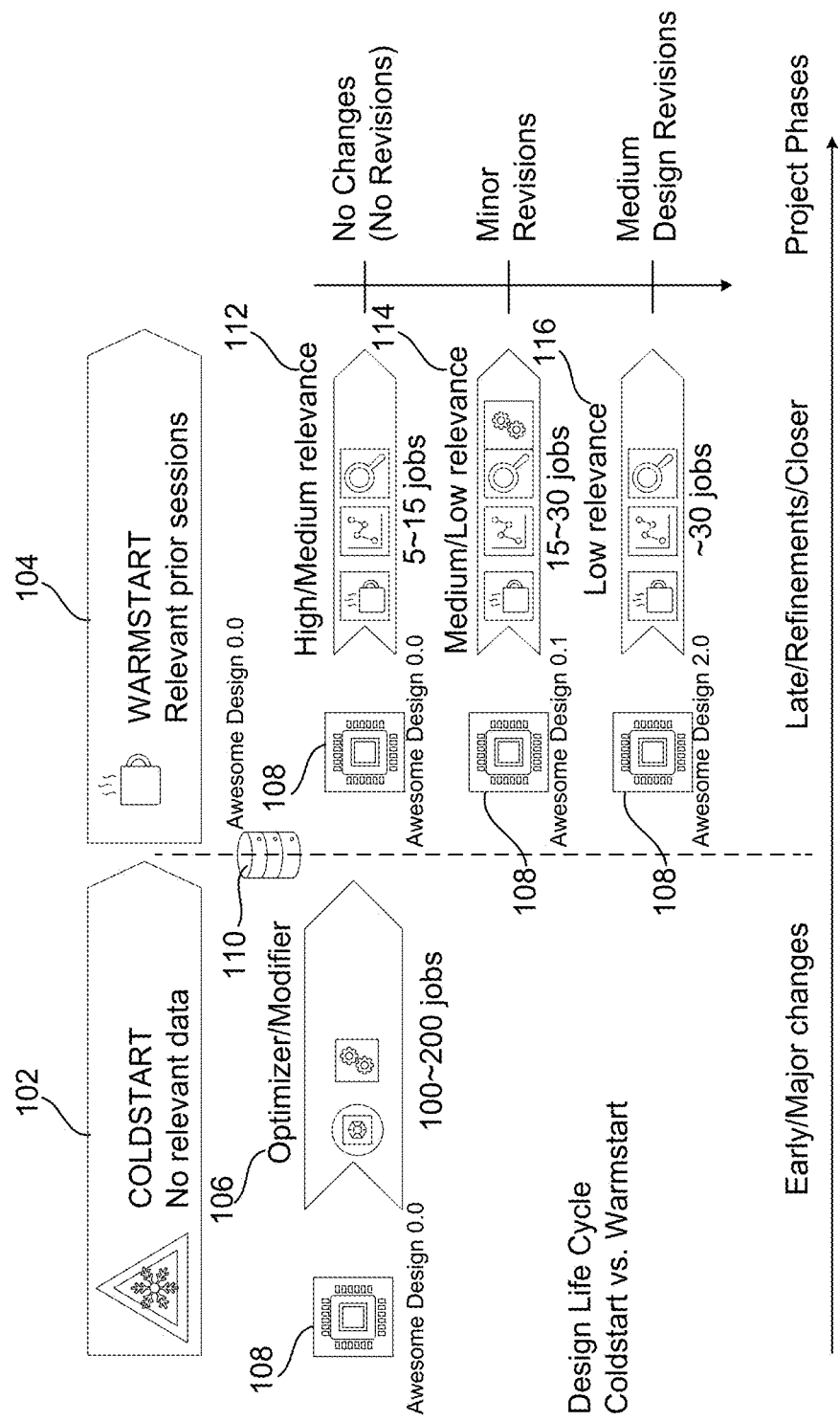
FIG. 1 illustrates different modes of optimizing or modifying a current circuit design, including a coldstart mode and a warmstart mode, according to some embodiments of the present disclosure.

Design optimization (or modification) of integrated circuits can be an intimidating task. Even with the use of electronic design automation (EDA) tools to perform design optimization, there can still be a relatively large runtime (e.g., a large runtime could take weeks) of EDA flows (e.g., including synthesis to layout placement and event testing and verification stages of EDA) and there is an exponentially large search space of design parameters (e.g., the search space of a hundred independent binary design parameters can include 2100 design configurations). In design optimization, IC designers can control the size of the search space by deciding what permutons to include in their search. In practical optimization scenarios, the number of design configurations can still reach 100,000 to millions. Therefore, there is a need for a design optimization tool that enables a user to achieve results that are better and faster. The present disclosure describes a technique of improving a current circuit design using machine learning based on relevant prior circuit design sessions. This technique can be referred to as design space optimization that incorporates artificial intelligence, which enables users to control parameters (e.g., how many permutons, how many designs choices, how many machines to dedicate to EDS, etc.) to search a very large design parameter space in a reasonable amount of time while avoiding relatively large computation cost. A design parameter space is composed of a combination of permutons (defined below) that either expose EDA optimization application options, user introduced design choices or design optimization constraints. These modification or optimization techniques can be implemented in a current circuit design session (i.e., a current modification session) to use results of one or more prior circuit design sessions (i.e., previous modification sessions).

A component of the techniques described herein include a warmstart session (or more), and can enable a system to learn from previous implementations of EDA tools applied to a specific design or a group of designs having at least some characteristics that are similar to or the same as a current circuit design that is being worked on during a current design session. Learning from previous design sessions can improve on the quality of design results and can reduce computation requirement. For example, a warmstart session can enable the system to find a relatively optimal design setting (e.g., design value) for a current circuit design in a relatively short amount of time while minimizing computation cost by learning from data previously collected from an IC designer's modification session, either by finding the exact optimal setting, reducing the search space by optimal range calculation, or by structurally searching subgroups of settings from previous multiple modification sessions.

Each time a modification session is used to execute a search for favorable points in the design parameter space which improves user defined targets and metrics that provide the best possible power, performance and area for the IC being designed, a unique session ID may be created and results related to the search may be stored under the session ID to identify previous circuit designs that are similar to the current circuit design for the purpose of optimizing the current circuit design. Results may include, among other things, every permuton setting (e.g., value) that was tried for the search and every power consumption result, performance result and area result (PPA) produced by each permuton setting. Herein, a permuton is an input parameter and/or setting having a value that a modification session explores to improve PPA results, which may be primary metrics used to measure the quality of an integrated circuit (IC). For example, permutons can include, but are not limited to, tool application options (e.g. EDA software settings, such as "set_app_option-name opt.timing.effort-range {low medium high}"), library cell choices, constraint choices, flow variations (e.g., different stages or points of flow in the design process, changing a sequence of steps used to build the IC, such as adding an extra pass of congestion-driven placement), and design settings including IC size, IC aspect ratio, placement of macros, placement of pins in the IC, etc. Permutons in a coldstart session (described below) can be entirely or partially selected by the users. In a warmstart session (described below), the permutons can be selected by the system and identified in a list and presented to the user. The user can then select from the presented list. In some implementations, a warmstart session can provide multiple machine learning strategies including incrementally searching entire search spaces (e.g., the union of all permutons being explored), replaying (e.g., repeating processes) the best or desired prior search results, and restricting searches to good (e.g., most-productive, useful) regions of the search space by identifying optimal range permutons. Implemented learning strategies can be changed or adjusted based on how similar a prior search is with respect to a current design.

In various implementations, a warmstart session can allow circuit designers to choose among multiple search strategies based on changes (at any stage of development) in the design or project goals or states. A design process can begin with a coldstart session, which is a modification session that is executed from scratch. In other words, the very first modification session can be a coldstart session. In a coldstart session, the first set of child runs (e.g., simulations, or other techniques to get optimization results based on permuton choices) can have random or pseudo random permuton settings. The initial set of permuton choices in a coldstart session can be chosen using a mathematical algorithm that is not random (e.g., sobol/uniform sampling). Herein, a child run is an individual point-tool run executed by a modification session (e.g., a simulation of the circuit design using the initial set of permuton choices). For example, a single modification session may execute hundreds of individual child runs, or only a few. As child runs complete, the system can begin to learn from these child runs using machine learning.

A coldstart session (or mode) generally requires a higher level of computation as compared to a warmstart session. The coldstart session produces relevant data about the design. This data may be captured in a database as data of a prior design session that is used by warmstart, which may then be used for refining the design such as by tuning (e.g., narrowing) the search space from all previous design session, adding or modifying permutons, changing parameter ranges, and refining metrics or goals.

Thus, a warmstart session can be described as a modification session that leverages the child runs (e.g., simulations) of previous sessions. Using warmstart sessions, the system can learn from all the runs captured in a database (e.g., a persistent database, such as on a disk, that stores the results of modification sessions). This technique improves the likelihood of success and thus may lower the number of child runs needed to improve PPA. Therefore, since fewer runs are needed to improve the PPA, the amount of computing resources and/or processing utilization can be reduced, resulting in overall improvement in the EDA computer hardware. When using a warmstart session, users may change their PPA goals (e.g., PPA requirements, such as specific PPA criteria that must be satisfied). With such changes, during the warmstart session the system can automatically re-train itself using the data in the database. Users can also change their search space, for example, by adding or removing permutons. The more design sessions that are performed the more efficient and accurate the modification sessions can become.

Depending on the amount of change involved in a current design session, a user may select among different relevance settings during the warmstart session for a particular previous circuit design, such as high relevance (or high significance), medium relevance (or medium significance), or low relevance (or low significance). Relevance refers to how "similar" a prior design session is compared to the current design session. If the prior session is from the same design, has the same permuton space, and targets the same PPA goals, then its prior session relevance is "high". If the prior session is from a similar design (e.g., some components of the circuit design of the prior session are the same or similar to the components of the current circuit design), then its prior session relevance is "medium". If the prior session is from a different design, then its relevance would be "low". Users may implement a warmstart session using multiple prior sessions with mixed relevance levels. During a warmstart session, the system can automatically apply different learning strategies depending on the prior session relevance. By specifying high, medium, or low relevance, users may trigger complex well-tested design strategies. A user may select high relevance for a current design session that involves relatively few design changes with respect to the previous design session(s) and may select low relevance for a current design session that involves relatively many design changes with respect to the previous design session(s).

FIG. 1 illustrates a design life cycle 100 using a coldstart session 102 and a warmstart session 104. A design life cycle 100 can begin with a coldstart session 102, wherein relevant information from a database with respect to the new circuit design does not yet exist. For example, the coldstart session 102 of the design life cycle 100 may be used for new or early stages of a current circuit design or for existing circuit designs that are to be subjected to substantial changes. In contrast to the coldstart session, processes in the warmstart session 104 of the design life cycle 100 have access to data that is relevant to the current circuit design. This data may be, for example, from prior design sessions that are relevant to the current circuit design.

As illustrated, the coldstart session 102 of the design life cycle 100 uses an optimizer/modifier 106 to optimize or modify a current circuit design 108 during a number of jobs (e.g., design sessions, searches and/or simulations). For example, 100 to 200 jobs (e.g., child runs) may be performed during the coldstart session 102 of the design life cycle 100. During the jobs, permuton settings (such as those described above including design parameters settings, design constraints tool application options, changes to EDA flow, etc.) are adjusted to improve the PPA results.

As explained above, the design process can start with a coldstart session 102, which requires a higher level of computation as compared to the warmstart session 104. Once relevant data about the circuit design is captured in a database 110, the warsmtart session 104 can use different strategies to optimize the current circuit design 108. Depending on the amount of differences between the current circuit design and the previous circuit designs, the warmstart session 104 can operate according to high relevance 112, medium relevance 114 or low relevance 116. The user can select the previous optimization sessions or the system can automatically select or suggest previous sessions to be considered by the user. The previous session or sessions can be selected in dependence on values that are obtained from simulation data that resulted in a simulation of the previous circuit design that provide results that satisfy a define criteria or threshold. High relevance 112, medium relevance 114 and low relevance 116 for the current circuit design 108 can be selected according to a selection by the user or by a selection of the system.

High Relevance

If a current circuit design has only relatively minor or no changes with respect to a previous circuit design (i.e., there are relatively minor or no differences between the current circuit design and the previous circuit design), then the system can implement the circuit optimization using high relevance 112, which generally bases searches on exact or near-exact settings of best PPA results from prior sessions. For example, if there is high relevance 112, a very similar previous circuit design was found and the system can use the same permuton settings that were used during the optimization of the very similar circuit design when simulating the current circuit design to optimize the current circuit design. A high relevance 112 warmstart session 104 can replicate good result from prior sessions in conjunction with incremental searches of new parameters or dimensions of the search space through addition of new permutons that were not searched before. A new permuton can be added by the user or it can be automatically identified and added by the system. The high relevance 112 warmstart session 104 can involve a small number of jobs (e.g., 5 to 15 jobs). A job is a simulation that includes (i) setting the permuton values and then (ii) performing the simulation of the circuit design to get PPA results. For example, a job can be an invocation of an EDA flow stage/command.

With a high relevance 112 warmstart session 104, permutons values (i.e., values of permuton settings) for a new job can exactly match the successful values from the prior sessions. The number of parameter sets of permuton setting to rerun in the high relevance 112 warmstart session 104 can be controlled or set by a user or they can be automatically controlled based on the PPA results after each job. Further, the methods according to which PPA results are obtained can be controlled or set by a user or they can be automatically controlled. For example, a user can specify "target" values for each metric of interest (e.g., power, frequency, etc.) and the user can specify acceptable tradeoffs between metrics (e.g., how much power increase can be accepted for a certain percentage of increased frequency (speed)).

Low Relevance

If a current circuit design has relatively major changes with respect to the previous circuit design (i.e., there are major differences between the current circuit design and the previous circuit design), then the system can implement the circuit optimization using low relevance 116. In a low relevance 116 warmstart session 104 the system can assign a calculated reduced range for each permuton to obtain best PPA results from prior sessions (e.g., from a previous coldstart session 102) can be used to identify optimal ranges for a new search of the design space. This can result in a search with reduced ranges for the permutons, such that the search space can be reduced. A user can specify, for example, their "top" runs (simulations, etc.) with respect to the PPA results from a previous search and the system can reduce the permuton ranges to encompass only those "top" runs and then start a new search with the reduced ranges. Low relevance 116 can also support addition of new permutons to incrementally search new dimensions of a circuit design. Optimal range calculations can considerably reduce the size of the search space and can enable the system to more efficiently look for optimal design settings (e.g., permuton settings). A low relevance 116 warmstart session 104 can potentially improve the computation requirement for optimization of the current circuit design by a factor of four times, for example. The low relevance 116 warmstart session 104 can involve a higher number of jobs (e.g., around 30 jobs) in order to achieve good PPA results based on data from a previous circuit design (previous session) that is relatively major differences with respect to the current circuit design.

With a low relevance 116 warmstart session 104, the permuton values for the new jobs can be sampled from a maximum range of permuton settings (i.e., the maximum range of permuton values for the permuton settings) from the jobs that provided the best PPA results of the prior sessions. This in effect means that the full range of any given parameter (e.g., permuton setting) is likely to be reduced to a successful range as determined by the range of values in the successful runs in the prior sessions. The number of parameter sets to run (i.e., jobs to run) in the low relevance 116 warmstart session 104 can be controlled or set by a user or they can be automatically controlled based on the PPA results after each job. Further, the methods according to which PPA results are obtained can be controlled or set by a user or they can be automatically controlled.

Medium Relevance

If a current circuit design has moderate to no changes with respect to a previous circuit design (i.e., there are moderate differences between the current circuit design and the previous circuit design), then the system can implement the circuit optimization using medium relevance 114. A medium relevance 114 warmstart session 104 can retrain the system using relevant prior session data (e.g., permuton values of permuton settings from previous sessions that provided good results) and can provide an incremental exploration of the search space at the discretion of the user to add new permutons to the prior search (e.g., a warmstart session can learn from the prior session permuton settings and then new permutons can be added based on what was learned). A medium relevance 114 warmstart session 104 can emulate a multi-batch optimization and can enable learning across multiple sessions and across similar designs. Searches can be organized in "batches," such that each batch is a set of simulations that have been run in parallel. For example, each batch could consist of 30 parallel runs. Medium relevance 114 allows a user to pick up right from their last search and continue searching for their next batch of runs. A medium relevance 114 warmstart session 104 can also provide incremental searches of new dimensions through addition of new permutons with respect to the permutons utilized in the prior sessions, as discussed above. If the new permutons are not meeting a desired target, then the system can automatically add new permutons to the search to focus on whatever aspect (e.g., power) of the desired results is lacking. Further, a medium relevance 114 warmstart session 104 can exploit the maximum benefits of the modification sessions. The medium relevance 114 warmstart session 104 can involve a medium number of jobs (e.g., between 15 and 30 jobs). The number of parameter sets to run (i.e., jobs to run) in the medium relevance 114 warmstart session 104 can be controlled or set by a user or they can be automatically controlled based on the PPA results after each job. Further, the methods according to which PPA results are obtained can be controlled or set by a user or they can be automatically controlled.

Warmstart and Flow Slicing

Figure 2:
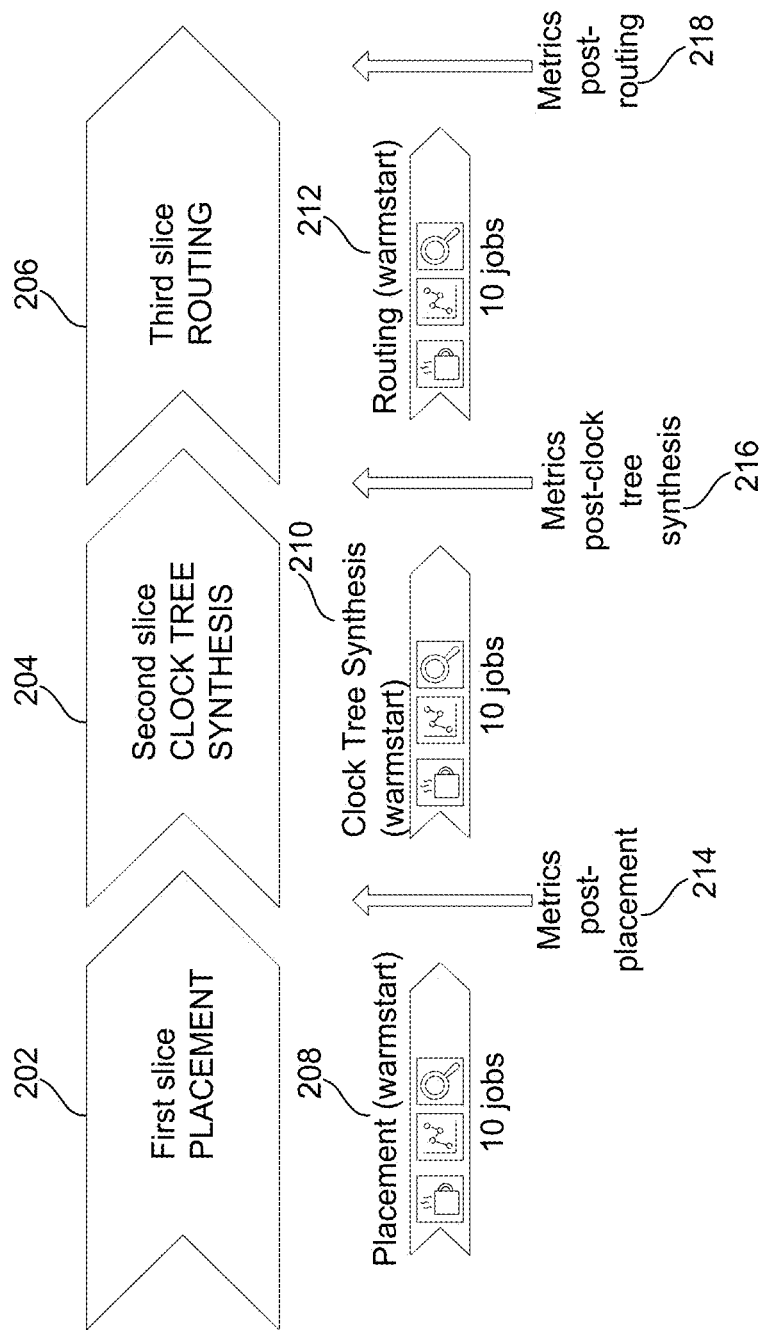
FIG. 2 illustrates warmstart sessions of optimizing or modifying a current circuit design at different points in a design process flow, according to some embodiments of the present disclosure.

In some embodiments, a warmstart session 104 can be implemented using flow slicing, which is a process for preforming a warmstart session 104 beginning and/or ending at selected points in a design process flow (e.g., physical placement of circuit components such as transistors or capacitors, routing of the connections of the circuit components by multiple conductors, clock tree synthesis, logic synthesis and register transfer level (RTL) optimization, to list a few, wherein many other points in a design process flow will apparent to a person of ordinary skill in the art). Clock tree synthesis includes inserting buffers to drive clock networks, where clock networks can span the entire circuit design and can consist of possibly millions of "endpoints" (e.g., components that need to receive a clock signal). This clock tree synthesis can insert "trees" of buffers to drive all of the endpoints scattered across the circuit design within acceptable timing constraints. Such points in the design process may correspond to a "slice" of a design flow. In other words, a flow slice is a subset of the total design flow. For example, a flow slice may correspond to, among other things, placement, clock tree synthesis, and routing, as mentioned above. In some implementations, the system can optimize design flows one slice (e.g., point) at a time. Depending on the slice being executed, different PPA metrics may be optimized. FIG. 2 illustrates warmstart sessions of optimizing a current circuit design at different points in a design process flow. For example, each slice (e.g., point) of a design process flow may be optimized individually as shown in the process flow 200 illustrated in FIG. 2.

Specifically, FIG. 2 illustrates a first slice 202 that corresponds to physical placement of components of the circuit, a second slice 204 that corresponds to clock tree synthesis of the circuit and a third slice 206 that corresponds to routing of the connections within the circuit. During the first slice 202, the modification session (e.g., the warmstart session 208) will run a certain number of jobs (e.g., 10 jobs, determined based on high, medium or low relevancy) with respect to changing permuton settings regarding the physical placement of the components of the circuit. The values of the permuton settings can be determined by implementing machine learning to search for and find prior sessions that are similar to the current session. After the jobs are ran, results 214 can be determined (e.g., PPA results and metrics). During the second slice 204, the modification session (e.g., the warmstart session 210) will run a certain number of jobs (e.g., 10 jobs, determined based on high, medium or low relevancy) with respect to changing permuton settings regarding and that relate to clock tree synthesis of the circuit. After the jobs are ran, results 216 can be determined (e.g., PPA results and metrics). During the third slice 206, the modification session (e.g., the warmstart session 212) will run a certain number of jobs (e.g., 10 jobs, determined based on high, medium or low relevancy) with respect to changing the routing connections of the components of the circuit. After the jobs are ran, results 218 can be determined (e.g., PPA results and metrics). All of the results 214, 216 and 218 can be stored in the database for use in future current design sessions.

Figure 3:
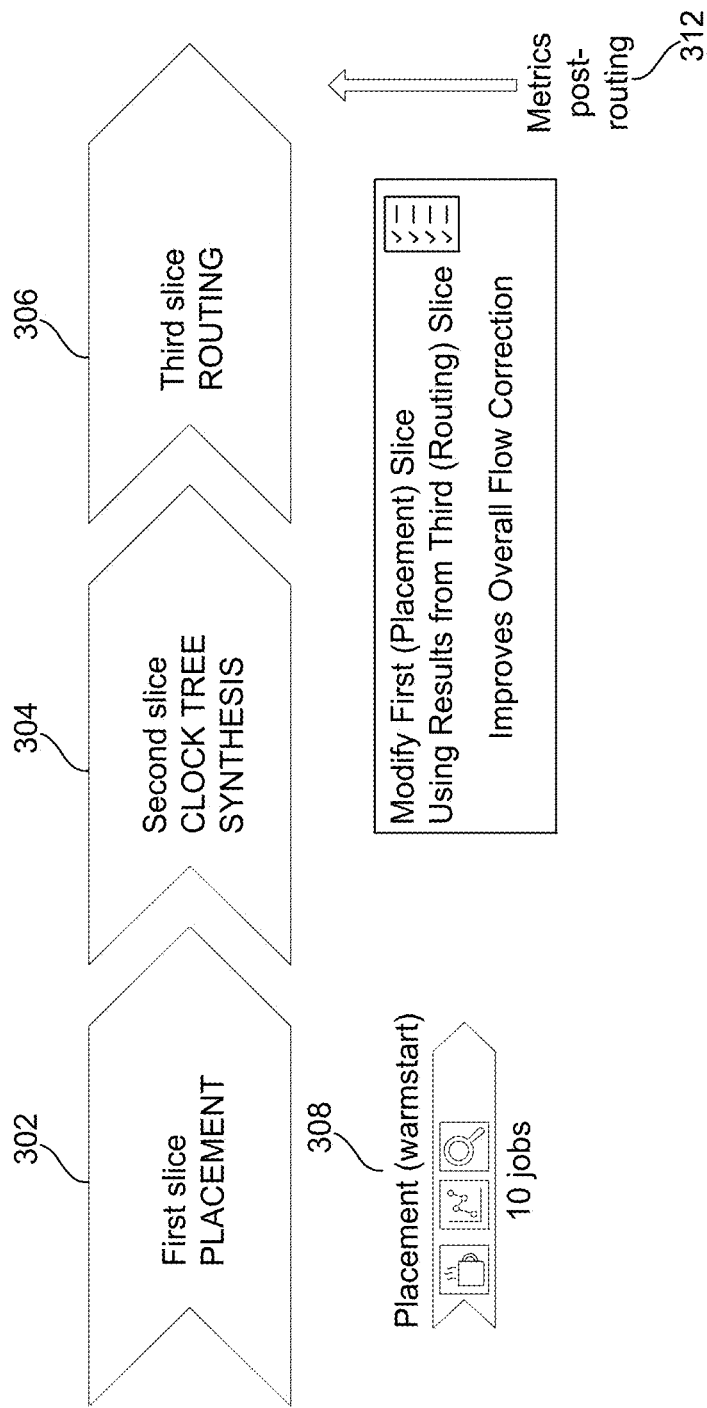
FIG. 3 illustrates a warmstart session of optimizing or modifying a current circuit design at one particular point in a design process flow using simulation data obtained at a different point in the design process flow, according to some embodiments of the present disclosure.

FIG. 3 illustrates a warmstart session of optimizing a current circuit design at one particular point in a design process flow using simulation data obtained at a different point in the design process flow. Specifically, in other implementations as illustrated in FIG. 3, a flow slicing mode of a warmstart session may target PPA miscorrelation between early and late stages of a design process, which is described in detail below. PPA miscorrelation refers to the best simulation results in a final stage of a design flow (e.g., the final stages of the circuit design) not necessarily coming from simulation data obtained in the early stages of the design flow (e.g., the early stages of the circuit design), and visa-versa. For example, chip frequency at a "placement" step is only an estimate and can be wrong, which makes it difficult to choose which "configuration" at the "placement" step will yield the best final frequency at the end of the chip design process. This technique accounts for a miscorrelation between PPA measurements in early stages of an EDA flow versus late stages of the EDA flow. As another example, timing paths that may be considered to not be critical in the early stages of the design process may become a bottle neck and become critical at the end of the EDS flow design process, and visa-versa. In this implementation of flow slicing, warmstart sessions can optimize the design at early stages of the design flow using results of previous relevant full flow executions (e.g., later stages) of the previous circuit design (e.g., early stages of the circuit design can use optimizations that were obtained from later stages of the previous circuit design from the other sessions). For example, during a first slice 302, a warmstart session 308 can run a certain number of jobs (e.g., 10 jobs, determined based on high, medium or low relevancy) by setting the permuton values (for permuton settings) based on PPA results or metrics obtained from a last point in the design process from a previous session (e.g., based on PPA results or metrics 312 obtained from a warmstart session of a third slice 306, or a second slice 304). In other words, during the first slice 302, the warmstart session 308 can run a certain number of jobs with respect to changing permuton settings, regarding the physical placement of the components of the circuit, based on the PPA results or metrics 312 obtained from running a warmstart session during the third slice 306 with respect to the routing of the connections of the components of the circuit from a previous session. In other words, the warmstart session 308 can optimize (modify) an intermediate point in the flow (e.g., placement) using a final point in the flow (e.g., routing) to determine PPA results. Similarly, previous session PPA results or metrics obtained from running a warmstart session during a second slice 304 directed to clock tree synchronization can be used during the warmstart session 308 of the first slice 302.

In this mode the warmstart sessions can achieve additional PPA improvements by leveraging PPA information from later points in the design process.

Multi-Session Warmstart

Multi-session Warmstart refers to an implementation of warmstart sessions that uses data from multiple prior warmstart sessions. For example, a current warmstart session can utilize and learn from data stored in memory and generated by multiple prior warmstart sessions. In some embodiments, a warmstart engine can be capable of using a divide and conquer strategy, such as partitioning the search space into overlapping and/or non-overlapping partitions. For example, if there are 20 permutons, they can be divided into 2 groups of 10. Then each group of 10 can be searched separately. Then a warmstart session can be used to unite all of the permutons so that essentially all 20 permutons have been searched. This can be referred to as a structured search, which improves the computational efficiency of the system. This can enable system to search relatively small search spaces more efficiently and combine the results into a superset session. This feature can be automated (e.g., without user initiation) by an algorithm for automatic structural search, which refers to a process of learning from multiple prior warmstart sessions that searched completely different permuton spaces (e.g., a set of permutons that can be independently searched). For example, a warmstart session can intelligently combine the permuton spaces as part of the learning process (e.g., a warmstart session can use an algorithm to guess a permuton setting from different search space; a warmstart session can find permutons that are very effective in improving PPA results vs permutons that are not at all effective; and a warmstart session can them combine the most effective permutons and construct a search space that is significantly smaller by only exploring permutons that are the most effective and eliminate permutons that are not effective in improving the PPA results). An intelligent union of all the prior spaces can be performed. In some implementations, however, a warmstart engine can fully enable expert users to perform structural searches, as discussed above.

In some embodiments, the warmstart engine can use design features to identify similarities between existing design data at databases in customer sites against a new design to enable the warmstart engine to optimize the new design directly by recommending settings without relying on a coldstart session. In other words, the warmstart engine can look at multiple databases of a particular customer to try to find existing design data that will be helpful in starting a warmstart session without needing to have a coldstart session.

Figure 4:
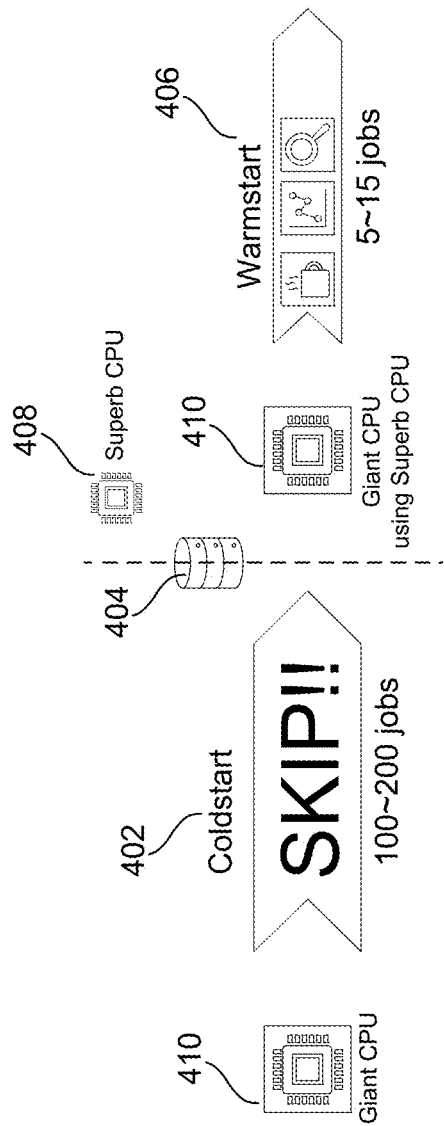
FIG. 4 illustrates skipping a coldstart session for a new circuit design by utilizing simulation data obtained from a simulation of a previous circuit design, according to some embodiments of the present disclosure.

FIG. 4 illustrates an implementation 400 in which a coldstart session 402 can be bypassed by searching databases 404 for existing design data that is relevant to a new circuit design. Then a warmstart session 406 can be utilized for the new circuit design using the existing design data from the databases 404. This embodiment can substantially reduce computation requirements by eliminating the need for the coldstart session (e.g., 100 to 200 jobs, for example, can be avoided because of the existing design data in the databases 404). As illustrated in FIG. 4, previous design data from a superb CPU 408 can be used for the new circuit design of a giant CPU 410 by bypassing the coldstart session 202 with the giant CPU 410 and starting the warmstart session 406 to optimize the giant CPU 410 using the design data from the superb CPU 408. The design data (e.g., design features) can be collected through propriety ml_commands in a Fusion Complier (FC). FC is a Synopsys EDA product that the system can use to execute flow slices. Note that "ml_commands" are used to gather information directly from the FC for use in a modification session, for example. The design data (e.g., design features) can include design hierarchy name similarities, critical path name similarities, and location-based images of the design at different stages of the flow.

The DSP.ai can provide a recommendation of permuton settings at session level or fine-tuned by identifying similar runs (e.g., once a similarity between circuit designs are established, a warmstart session can suggest permutons that were effective for the similar design to be used in the search performed for the current circuit design).

Figure 5:
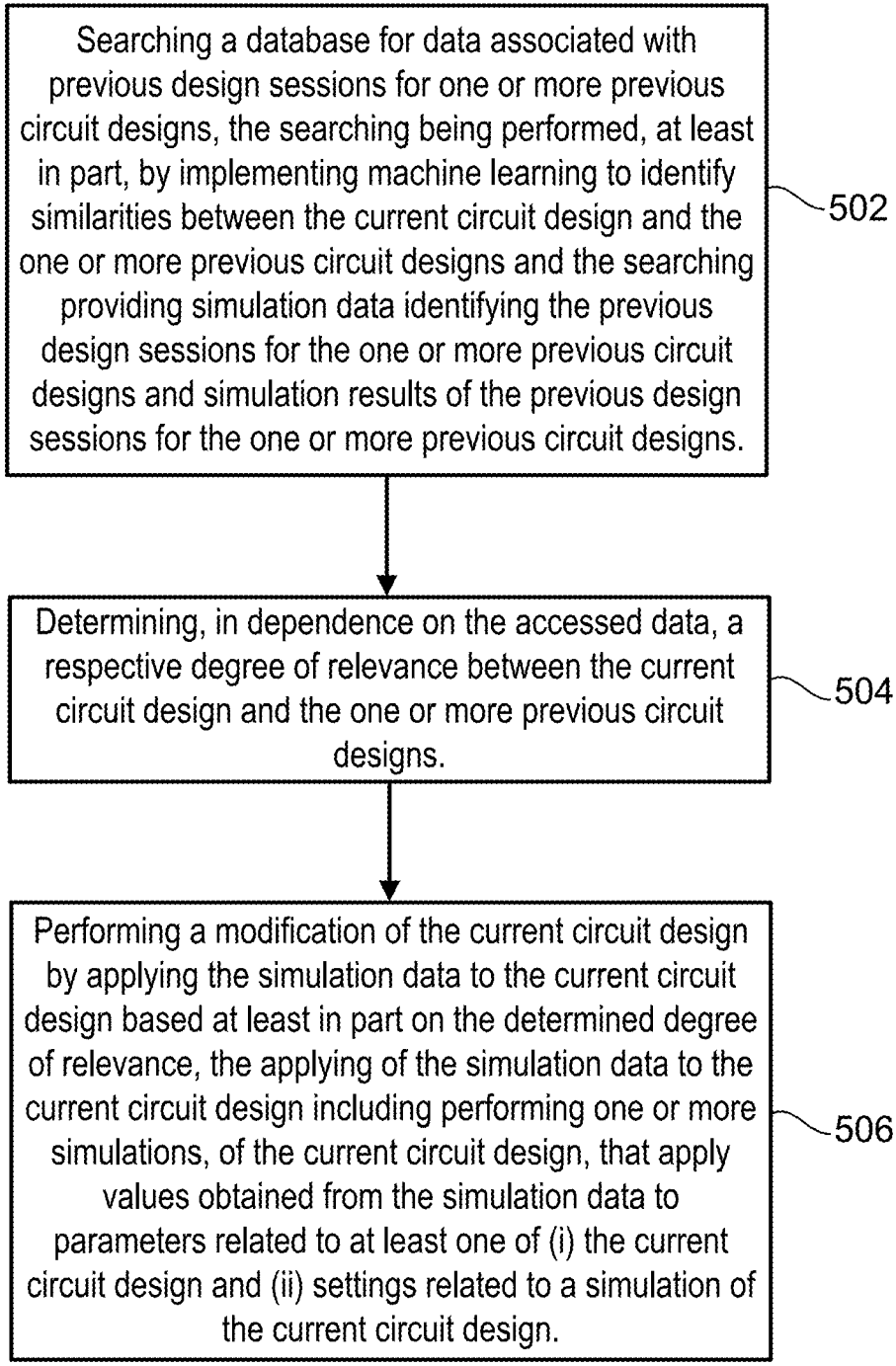
FIG. 5 depicts a flowchart of various operations performed to optimize or modify a current circuit design using simulation data obtained from simulating a previous circuit design, accordance with some embodiments of the present disclosure.

FIG. 5 illustrates a flowchart 500 describing operations that use machine learning to optimize a current circuit design in a current design session. The operations include an operation 500 of searching a database for data associated with previous design sessions for one or more previous circuit designs, the searching being performed, at least in part, by implementing machine learning to identify similarities between the current circuit design and the one or more previous circuit designs and the searching providing simulation data identifying the previous design sessions for the one or more previous circuit designs and simulation results of the previous design sessions for the one or more previous circuit designs, an operation 502 of determining, in dependence on the accessed data, a respective degree of relevance between the current circuit design and the one or more previous circuit designs, and an operation 504 of performing an optimization of the current circuit design by applying the simulation data to the current circuit design based at least in part on the determined degree of relevance, the applying of the simulation data to the current circuit design including performing one or more simulations, of the current circuit design, that apply values obtained from the simulation data to parameters related to at least one of (i) the current circuit design and (ii) setting related to a simulation of the current circuit design.

Figure 6:
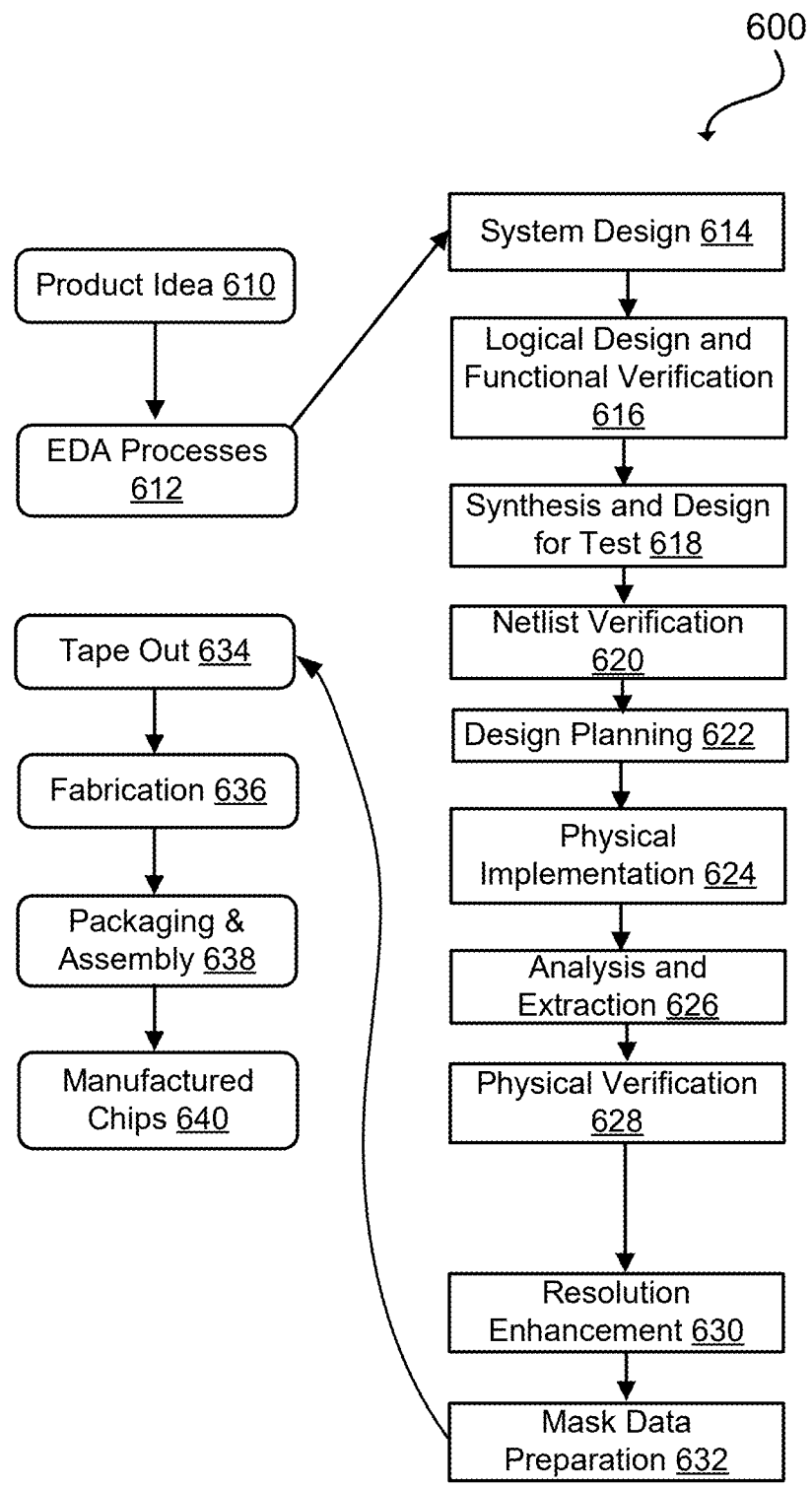
FIG. 6 depicts a flowchart of various processes used during the design and manufacture of an integrated circuit in accordance with some embodiments of the present disclosure

FIG. 6 illustrates an example set of processes 600 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes can include implementation of the modification (or optimization) sessions, as described herein. Further, these processes start with the creation of a product idea 610 with information supplied by a designer, information which is transformed to create an article of manufacture that uses a set of EDA processes 612. When the design is finalized, the design is taped-out 634, which is when artwork (e.g., geometric patterns) for the integrated circuit is sent to a fabrication facility to manufacture the mask set, which is then used to manufacture the integrated circuit. After tape-out, a semiconductor die is fabricated 636 and packaging and assembly processes 638 are performed to produce the finished integrated circuit 640.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding systems of that layer (e.g., a formal verification system). A design process may use a sequence depicted in FIG. 6. The processes described by be enabled by EDA products (or EDA systems).

During system design 614, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 616, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 618, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 620, the netlist is checked for compliance with timing constraints and for correspondence with the HDL code. During design planning 622, an overall floor plan for the integrated circuit is constructed and analyzed for timing and top-level routing.

During layout or physical implementation 624, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 626, the circuit function is verified at the layout level, which permits refinement of the layout design. During physical verification 628, the layout design is checked to ensure that manufacturing constraints are correct, such as DRC constraints, electrical constraints, lithographic constraints, and that circuitry function matches the HDL design specification. During resolution enhancement 630, the geometry of the layout is transformed to improve how the circuit design is manufactured.

During tape-out, data is created to be used (after lithographic enhancements are applied if appropriate) for production of lithography masks. During mask data preparation 632, the 'tape-out' data is used to produce lithography masks that are used to produce finished integrated circuits.

A storage subsystem of a computer system (such as computer system 700 of FIG. 7) may be used to store the programs and data structures that are used by some or all of the EDA products described herein, and products used for development of cells for the library and for physical and logical design that use the library.

Figure 7:
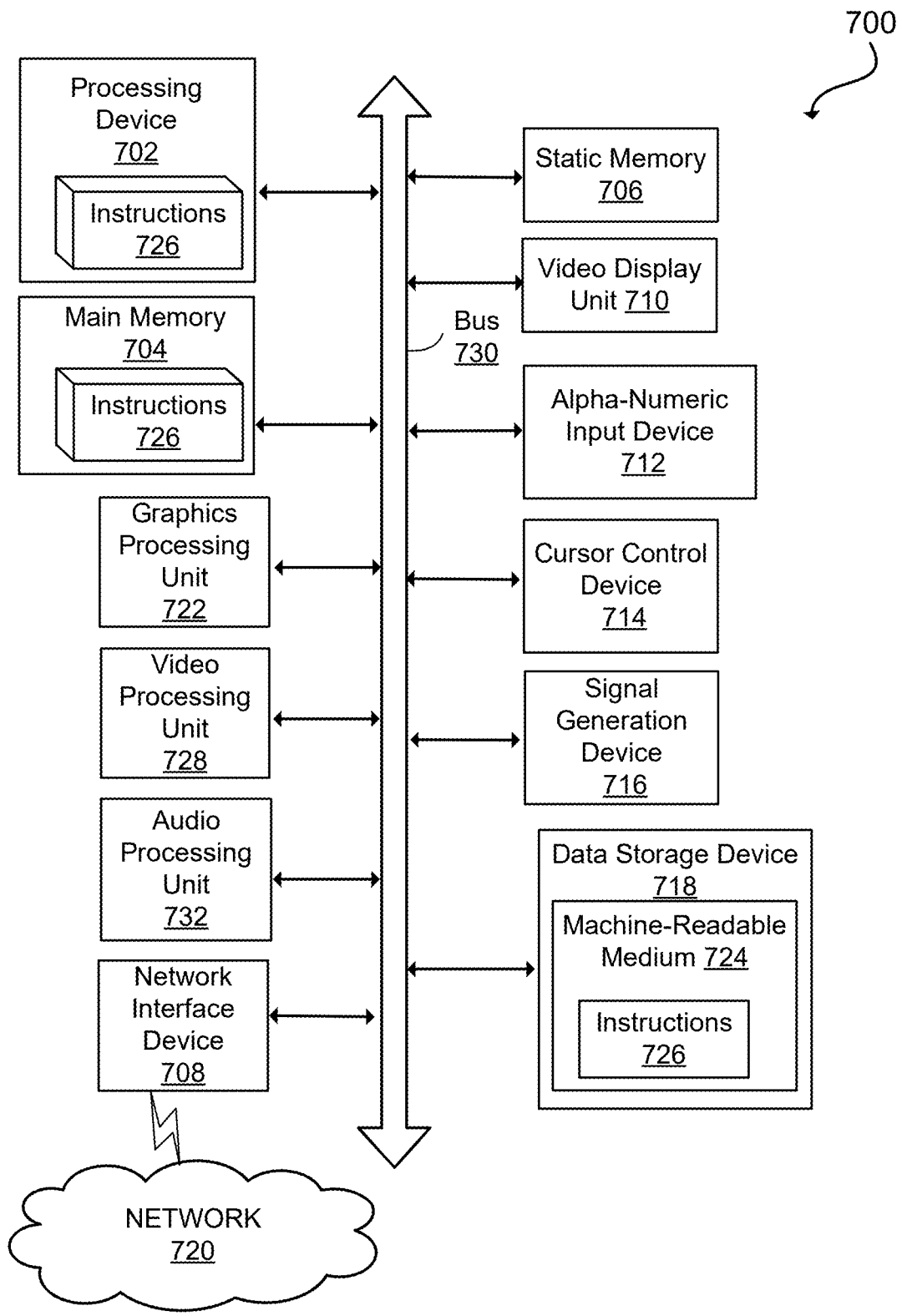
FIG. 7 depicts a diagram of an example computer system in which embodiments of the present disclosure may operate.

FIG. 7 illustrates an example machine of a computer system 700 within which a set of instructions, for causing the machine to perform any one or more of the methodologies discussed herein including the operations of the modification (or optimization) sessions, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM), a static memory 706 (e.g., flash memory, static random access memory (SRAM), etc.), and a data storage device 718, which communicate with each other via a bus 730.

Processing device 702 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 may also be one or more special-purpose processing devices such as an application specific integrated circuit (ASIC), a field programmable gate array (FPGA), a digital signal processor (DSP), network processor, or the like. The processing device 702 may be configured to execute instructions 726 for performing the operations and steps described herein.

The computer system 700 may further include a network interface device 708 to communicate over the network 720. The computer system 700 also may include a video display unit 710 (e.g., a liquid crystal display (LCD) or a cathode ray tube (CRT)), an alphanumeric input device 712 (e.g., a keyboard), a cursor control device 714 (e.g., a mouse), a graphics processing unit 722, a signal generation device 716 (e.g., a speaker), graphics processing unit 722, video processing unit 728, and audio processing unit 732.

The data storage device 718 may include a machine-readable storage medium 724 (also known as a non-transitory computer-readable medium) on which is stored one or more sets of instructions 726 or software embodying any one or more of the methodologies or functions described herein. The instructions 726 may also reside, completely or at least partially, within the main memory 704 and/or within the processing device 702 during execution thereof by the computer system 700, the main memory 704 and the processing device 702 also constituting machine-readable storage media.

In some implementations, the instructions 726 include instructions to implement functionality corresponding to the present disclosure. While the machine-readable storage medium 724 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 702 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are expressions used by those skilled in the data processing arts to effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

The invention claimed is:

1. A method of electronic design automation (EDA) using machine learning to modify a current circuit design in a current design session, the method comprising:
    searching a database for data associated with previous design sessions for one or more previous circuit designs, the searching being performed, at least in part, by implementing machine learning to identify similarities between the current circuit design and the one or more previous circuit designs and the searching providing simulation data identifying the previous design sessions for the one or more previous circuit designs and simulation results of the previous design sessions for the one or more previous circuit designs;
    determining, in dependence on the simulation data, a respective degree of relevance between the current circuit design and the one or more previous circuit designs; and
    performing a modification of the current circuit design by applying the simulation data to the current circuit design based at least in part on the determined degree of relevance, the applying of the simulation data to the current circuit design including performing one or more simulations, of the current circuit design, that apply values obtained from the simulation data to parameters related to at least one of (i) the current circuit design and (ii) settings related to a simulation of the current circuit design.

2. The method of claim 1, wherein the applying of the simulation data to the current circuit design modifies the current circuit design by adjusting parameters of the current circuit design and the simulation of the current circuit design in dependence on values obtained from the simulation data that resulted in a simulation of the previous circuit design that provided results that satisfy a defined criteria.

3. The method of claim 1, wherein the determining of the respective degree of relevance between the current circuit design and the one or more previous circuit designs comprises receiving, from a user, a selection of a relevance between the current circuit design and each of the one or more previous circuit designs.

4. The method of claim 3, wherein the relevance indicates one of a high similarity, a medium similarity and a low similarity between the current circuit design and each of the one or more previous circuit designs.

5. The method of claim 4, wherein a range of a number of simulations performed using different parameter values for the current circuit design is set in dependence on whether the relevance indicates high similarity, medium similarity or low similarity.

6. The method of claim 1, further comprising applying the simulation data, associated with multiple previous design sessions having varying degrees of relevance, to the current design session.

7. The method of claim 1, wherein the simulation data associated with the multiple previous design sessions includes one or more permuton settings that were simulated on previous circuit designs during the previous design sessions.

8. The method of claim 7, wherein the permuton settings includes one or more of (i) EDA operation options with respect to simulations of the previous circuit designs, (ii) EDA flow variations with respect to the simulations of the previous circuit designs, (iii) values of input parameters with respect to simulations of the previous circuit designs, (iv) input settings with respect to simulations of the previous circuit designs, and (v) design settings of the previous circuit designs during the simulations.

9. The method of claim 7, wherein the simulation data associated with the previous design sessions includes one or more results of the modifications of the previous circuit designs, the one or more results including power results, performance results and area results associated with the permuton settings implemented during the simulations.

10. The method of claim 1, wherein the searching of the database implements a searching strategy of searching the database for previous circuit designs having permuton settings that were applied on a previous design modification during the previous design sessions, wherein the searching strategy is selected in dependence on the respective degree of relevance between the current circuit design and the one or more previous circuit designs.

11. The method of claim 1,
    wherein the method further includes receiving a selection of a point in a design process flow, from among a plurality of points in the design process flow, to simulate for the current circuit design,
    wherein the searching of the database implements the machine learning to identify similarities between the current circuit design and the one or more previous circuit designs for the selected point in the design process to provide simulation data that is relevant to the selected point in the design process, and
    wherein the performing of the modification of the current circuit design applies the simulation data that is relevant to the selected point in the design process.

12. The method of claim 11, wherein plurality of points in the design process flow include, at least, physical placement of circuit components, routing of connections of the circuit components and clock tree synthesis.

13. A non-transitory computer-readable recording medium comprising stored instructions, which when executed by a processor, cause the processor to use machine learning to optimize a current circuit design in a current design session by performing operations comprising:

搜索 a database for data associated with previous design sessions for one or more previous circuit designs, the searching being performed, at least in part, by implementing machine learning to identify similarities between the current circuit design and the one or more previous circuit designs and the searching providing simulation data identifying the one or more previous circuit designs and simulation results of the one or more previous circuit designs;

determining, in dependence on the simulation data, a respective degree of relevance between the current circuit design and the one or more previous circuit designs; and performing an optimization of the current circuit design by applying the simulation data to the current circuit design based at least in part on the determined degree of relevance, the applying of the simulation data to the current circuit design including performing one or more simulations, of the current circuit design, that apply values obtained from the simulation data to parameters related to at least one of (i) the current circuit design and (ii) a simulation of the current circuit design.

14. The non-transitory computer-readable recording medium of claim 13, wherein the similarities between the current circuit design and the one or more previous circuit designs are identified by the machine learning based on at least one of (i) structural design features between the previous circuit designs and the current circuit design and (ii) performance results between the previous circuit designs and the current circuit design.

15. The non-transitory computer-readable recording medium of claim 13, wherein the similarities between the current circuit design and the one or more previous circuit designs are identified by the machine learning based on functional features between the previous circuit design and the current circuit design.

16. The non-transitory computer-readable recording medium of claim 13, wherein the database is a combination of databases utilized by a plurality of EDA implementations.

17. A system comprising a processor and a memory, the memory storing instructions that, when executed by the processor, cause the processor to use machine learning to modify a current circuit design in a current design session by performing operations comprising:

searching a database for data associated with previous design sessions for one or more previous circuit designs, the searching being performed, at least in part, by implementing machine learning to identify similarities between the current circuit design and the one or more previous circuit designs and the searching providing simulation data identifying the one or more previous circuit designs and simulation results of the one or more previous circuit designs;

determining, in dependence on the simulation data, a respective degree of relevance between the current circuit design and the one or more previous circuit designs; and performing a modification of the current circuit design by applying the simulation data to the current circuit design based at least in part on the determined degree of relevance, the applying of the simulation data to the current circuit design including performing one or more simulations, of the current circuit design, that apply values obtained from the simulation data to parameters related to at least one of (i) the current circuit design and (ii) a simulation of the current circuit design.

18. The system of claim 17, wherein the operations further include receiving a selection of a point in a design process flow, from among a plurality of points in the design process flow, to simulate for the current circuit design, and wherein the applying of the simulation data to the current circuit design selects simulation data, with respect to a previous circuit design, from another point in the design process flow that is different from the selected point in the design process flow.

19. The system of claim 18, wherein the other point in the design process flow is routing of connections of circuit components of the previous circuit design, wherein the selected point in the design process is physical placement of circuit components of the current circuit design, and wherein the simulation of the current circuit design simulates the current circuit design with respect to the selected point in the design process using simulation data obtained in dependence on the other point in the design process flow.

20. The system of claim 19, wherein the simulation data obtained in dependence on the other point in the design process flow is obtained from the database in dependence upon results from performing a simulation of the previous circuit design with respect to the routing of the connections of the circuit components of the previous circuit design, and wherein the simulation of the current circuit design is performed with respect to the physical placement of the circuit components of the current circuit design using the simulation data of the previous circuit obtained with respect to the routing connections of the circuit components of the previous circuit design.

* * * * *